(12) United States Patent
Kita

(10) Patent No.: US 7,333,337 B2
(45) Date of Patent: Feb. 19, 2008

(54) ELECTRIC JUNCTION BOX

(75) Inventor: Yukinori Kita, Yokkaichi (JP)

(73) Assignee: Sumitomo Wiring Systems, Ltd., Yokkaichi (JP)

(*) Notice: Subject to any disclaimer, the term of this patent is extended or adjusted under 35 U.S.C. 154(b) by 99 days.

(21) Appl. No.: 11/231,997

(22) Filed: Sep. 22, 2005

(65) Prior Publication Data

US 2006/0067058 A1    Mar. 30, 2006

(30) Foreign Application Priority Data

Sep. 24, 2004    (JP)    ............................. 2004-277038

(51) Int. Cl.
*H05K 7/20* (2006.01)
*F28D 15/00* (2006.01)

(52) U.S. Cl. ................ 361/710; 361/704; 361/719; 165/104.33; 165/185

(58) Field of Classification Search ............... 361/710, 361/687, 690, 694, 695, 704, 707, 719; 165/80.3, 165/104.33, 185; 428/604
See application file for complete search history.

(56) References Cited

U.S. PATENT DOCUMENTS

| | | | | |
|---|---|---|---|---|
| 662,567 | A * | 11/1900 | Lipowska et al. | 428/604 |
| 2,131,929 | A * | 10/1938 | Amme | 165/185 |
| 2,152,297 | A * | 9/1939 | Wilson | 428/604 |
| 2,245,069 | A * | 6/1941 | Clarke | 165/181 |
| 3,502,142 | A * | 3/1970 | Mcguffey | 165/170 |
| 3,790,859 | A * | 2/1974 | Schraeder et al. | 361/694 |
| 4,025,996 | A * | 5/1977 | Saveker | 428/594 |
| 4,558,736 | A * | 12/1985 | Ziemek | 165/183 |
| 5,224,538 | A * | 7/1993 | Jacoby | 165/166 |
| 5,365,402 | A * | 11/1994 | Hatada et al. | 361/699 |
| 5,552,634 | A * | 9/1996 | Schneider | 257/706 |
| 5,660,917 | A * | 8/1997 | Fujimori et al. | 428/195.1 |
| 5,794,684 | A * | 8/1998 | Jacoby | 165/80.3 |
| 5,882,213 | A * | 3/1999 | Witek et al. | 439/76.2 |
| 5,946,192 | A * | 8/1999 | Ishigami et al. | 361/704 |

(Continued)

FOREIGN PATENT DOCUMENTS

JP    2003-164039    6/2003

(Continued)

OTHER PUBLICATIONS

Johnson, IBM Technical Disclosure, Nov. 1972, pp. 1950-1951.*

(Continued)

*Primary Examiner*—Jayprakash Gandhi
*Assistant Examiner*—Robert J Hoffberg
(74) *Attorney, Agent, or Firm*—Greenblum & Bernstein, P.L.C.

(57) ABSTRACT

A heat sink in an electric junction box has thermal diffusion portions having one of convex and concave shapes on the surface. The structure enlarges a surface area of the heat sink compared to a configuration in which a surface has no concavity or convexity, thereby allowing fast heat dissipation from the surface of the heat sink to the exterior of the junction box. Further, the heat sink has the thermal diffusion portions on the entire plate surface. The structure enlarges the surface area of the heat sink compared to a configuration in which the thermal diffusion portions are provided to only a portion of the surface, thereby further enhancing the heat dissipation.

11 Claims, 5 Drawing Sheets

U.S. PATENT DOCUMENTS

| | | | |
|---|---|---|---|
| 6,034,727 A * | 3/2000 | Ito et al. ..................... 348/350 |
| 6,166,909 A * | 12/2000 | Sumida ....................... 361/704 |
| 6,282,092 B1 * | 8/2001 | Okamoto et al. ............ 361/704 |
| 6,302,185 B1 * | 10/2001 | Lee et al. ..................... 164/45 |
| 6,459,587 B1 * | 10/2002 | Chan ........................... 361/728 |
| 6,583,353 B2 * | 6/2003 | Murakoshi et al. ............ 174/50 |
| 6,698,511 B2 * | 3/2004 | DiBene et al. ................ 165/185 |
| 6,785,139 B2 * | 8/2004 | Onizuka et al. .............. 361/704 |
| 6,846,204 B2 | 1/2005 | Oda |
| 6,875,028 B2 | 4/2005 | Kita et al. |
| 6,898,084 B2 * | 5/2005 | Misra .......................... 361/710 |
| 6,913,070 B2 * | 7/2005 | Wang et al. ................ 165/80.3 |
| 7,003,970 B2 * | 2/2006 | Iida et al. .................... 62/259.2 |
| 7,151,668 B1 * | 12/2006 | Stathakis .................... 361/700 |
| 2004/0029420 A1 * | 2/2004 | Yamaguchi ................ 439/76.2 |
| 2004/0033730 A1 | 2/2004 | Oda |
| 2005/0221689 A1 | 10/2005 | Saka et al. |

FOREIGN PATENT DOCUMENTS

KR      2001026307 A *    4/2001

OTHER PUBLICATIONS

Machine English Translation of Onizuka et al. JP 2003-164039 A.*

English language Abstract of JP 2003-164039.

* cited by examiner

ELECTRIC JUNCTION BOX

CROSS-REFERENCE TO RELATED APPLICATIONS

The present disclosure relates to subject matter contained in priority Japanese Application No. 2004-277038, filed on Sep. 24, 2004, which is herein expressly incorporated by reference in its entirety.

BACKGROUND OF THE INVENTION

1. Field of the Invention

The present invention relates to an electric junction box and more particularly to an electric junction box including a heat sink including one of convex and concave shapes on the surface thereof.

2. Description of Related Art

The prior art, such as Japanese Patent Laid-open Publication No. 2003-164039, discloses an electric junction box that distributes power from a common vehicle power source to electronic units. In the electric junction box of the prior art, a bus bar board that constitutes a power circuit is adhered to a lower surface of a control circuit board. The bus bar board is provided with a heat sink material on a lower surface (a surface opposite to the surface adhered to the control circuit board). The heat sink, entirely formed of heat sink material that conducts heat well, such as aluminum, has a planar shape. A plurality of fins, aligned on right and left, project downward from a lower surface of the heat sink.

The construction of the prior art described above, however, has the drawback that space for the fins needs to be reserved. The electric junction box is generally connected to a battery via a cable or a wire harness and stored in an engine compartment. Since the space within the engine compartment is limited, a compact electric junction box is desired.

To reduce the space that a heat sink occupies, one option may be to use a laminated heat sink alone having no fins for heat dissipation. Insufficient dissipation of the heat from the circuitry, however, may harm control circuit elements mounted on the control circuit board. Therefore, it is required to downsize an electric junction box while maintaining sufficient heat dissipation.

SUMMARY OF THE INVENTION

The present invention is provided to address the above described problems and problems in the prior art. An object of the present invention is to provide a heat sink that provides high space efficiency and good heat dissipation.

An aspect of the present invention provides an electric junction box including a circuit including a control circuit board and a bus bar, the control circuit board having conductive circuits formed in and electronic components mounted on a first one of front and rear surfaces thereof and the bus bar provided on a second one of the front and rear surfaces of the control circuit board; a heat sink provided on the bus bar on a surface opposite to the surface facing the control circuit board through an insulating layer, the heat sink including a planar member including thermal diffusion portions having one of convex and concave shapes on a surface opposite to the surface contacting the bus bar; and a case containing the circuit and the heat sink. Further, the thermal diffusion portions are provided on substantially the entire planar surface of the planar member of the heat sink. Additionally, the heat sink includes convex shaped thermal diffusion portions projecting from the surface opposite to the surface contacting the bus bar. The electric junction box may further include a notch provided at a crest of each of the convex shaped thermal diffusion portions. The heat sink may include concave shaped thermal diffusion portions provided on the surface opposite to the surface contacting the bus bar. In a further aspect of the present invention, wherein the thermal diffusion portions are positioned at substantially equal intervals along the length and width of the planar member of the heat sink. The thermal diffusion portions may be positioned at unequal intervals along the length and width of the planar member of the heat sink. The thermal diffusion portions may be formed having substantially uniform size and shape. Further, the thermal diffusion portions may be formed having nonuniform size and shape; and the thermal diffusion portions may be provided on less than the entire planar surface of the planar member of the heat sink. Additionally, the heat sink includes a metal sheet.

A further aspect of the present invention provides a heat sink for a circuit including a control circuit board having conductive circuits formed in and electronic components mounted on a first one of front and rear surfaces thereof and a bus bar provided on a second one of the front and rear surfaces of the control circuit board, the heat sink provided on the bus bar on a surface opposite to the surface facing the control circuit board through an insulating layer, the heat sink including a planar member including thermal diffusion portions having one of convex and concave shapes on a surface opposite to the surface contacting the bus bar.

A further aspect of the present invention also provides a heat sink for a circuit including a control circuit board having conductive circuits formed in and electronic components mounted on a first one of front and rear surfaces thereof and a bus bar provided on a second one of the front and rear surfaces of the control circuit board, the heat sink provided on the bus bar on a surface opposite to the surface facing the control circuit board through an insulating layer, the heat sink including a planar member including thermal diffusion portions having a substantially planar shape and projecting from a surface opposite to the surface contacting the bus bar.

According to the present invention, the thermal diffusion portions having one of convex and concave shapes are provided on the surface of the heat sink. The structure increases a surface area of the heat sink compared to a flat surface with no concavity or convexity, thus quickly dissipating the heat to the exterior through the surface of the heat sink. The planar heat sink is capable of providing adequate heat dissipation without fins, thereby enhancing space efficiency and ensuring heat dissipation simultaneously.

According to the present invention, the heat sink is provided with the thermal diffusion portions throughout the plate surface. The structure increases a surface area of the heat sink compared to a configuration in which the thermal diffusion portions are provided to only a portion of the surface, thus improving heat dissipation. Furthermore, the heat dissipation is provided on the entire plate surface of the heat sink, thereby preventing local heat buildup in the circuitry.

BRIEF DESCRIPTION OF THE DRAWINGS

The above, and other objects, features and advantages of the present invention will be made apparent from the following description of the preferred embodiments, given as nonlimiting examples, with reference to the accompanying drawings in which.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Figure 1:
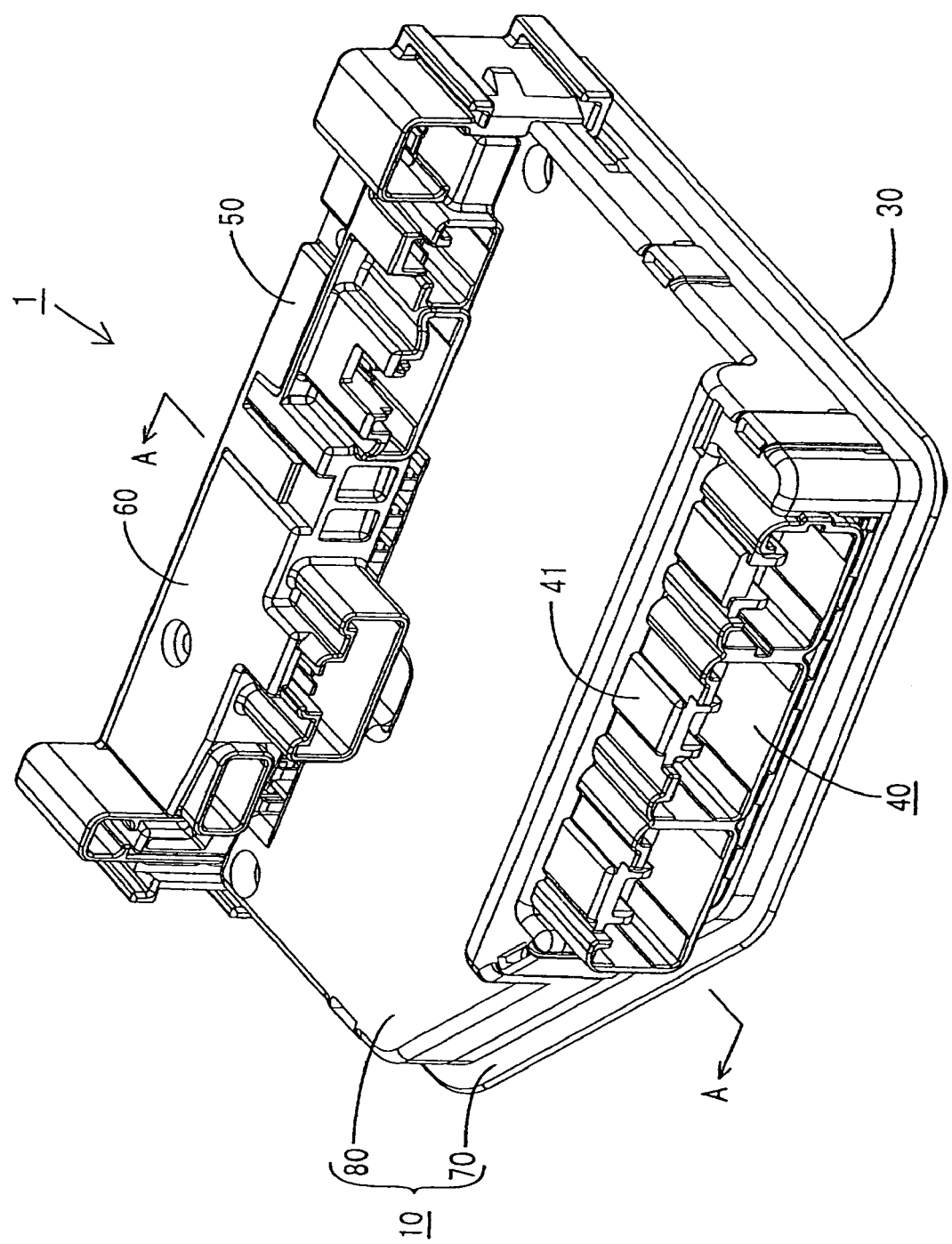
FIG. 1 is a perspective view of an electric junction box according to a first embodiment of the present invention.
Figure 2:
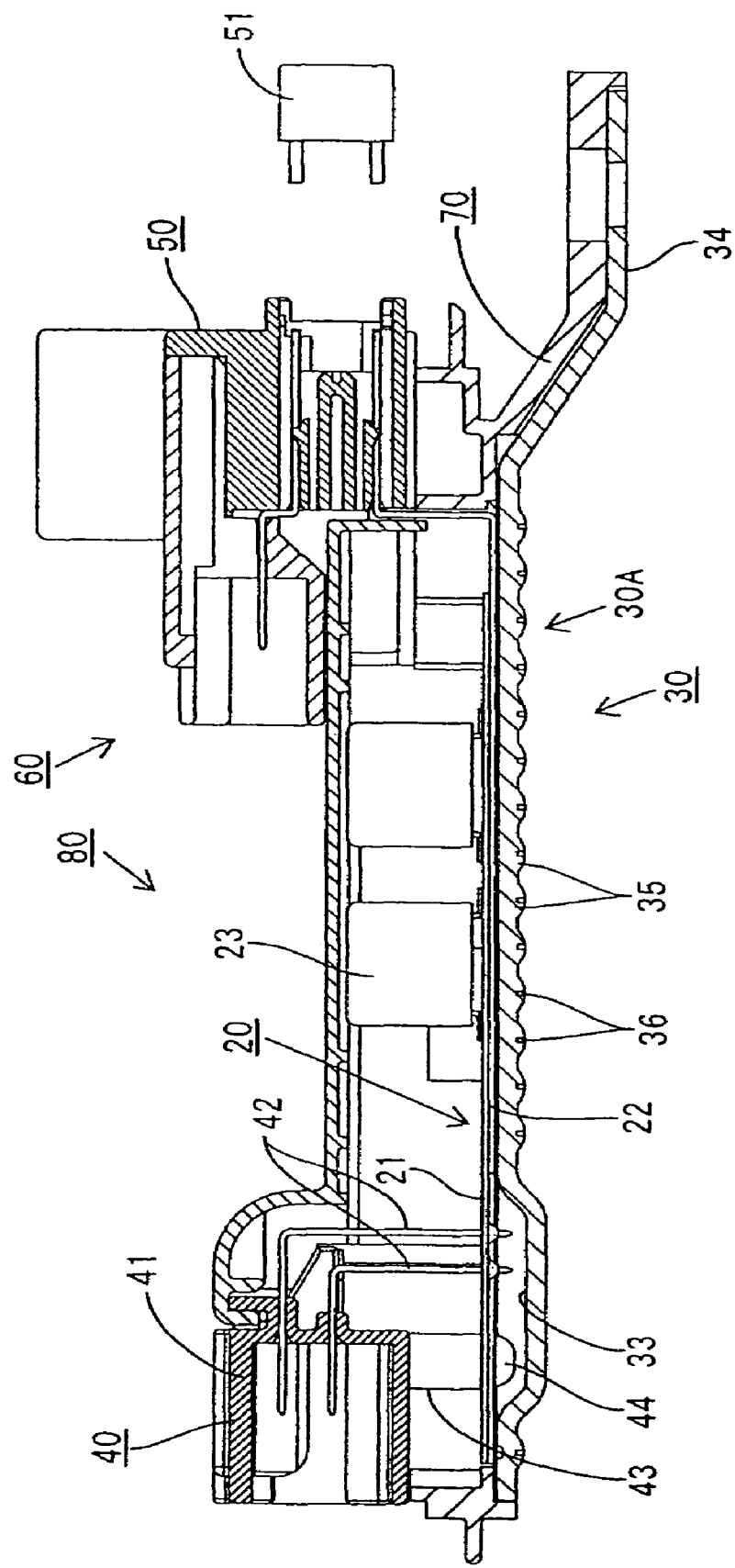
FIG. 2 is a cross-sectional view along section A-A of FIG. 1.
Figure 3:
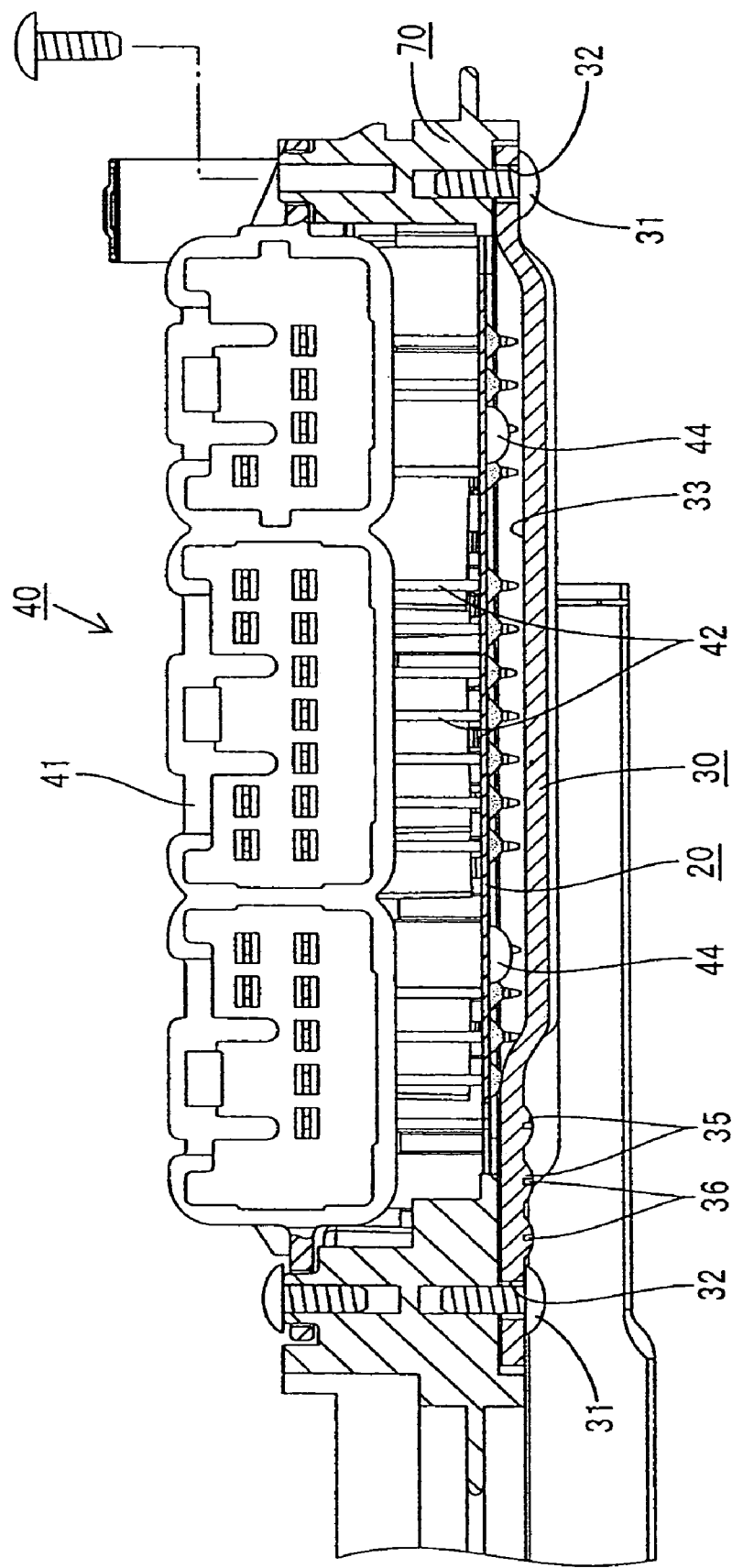
FIG. 3 is a partial cross-sectional front view of the electric junction box of FIG. 1.

The following describes a first embodiment of the present invention with reference to FIGS. 1 to 4. FIG. 1 is a perspective view of an electric junction box according to the first embodiment; FIG. 2 is a cross-sectional view along section A-A of FIG. 1; and FIG. 3 is a partial cross-sectional front view of FIG. 1. In the description below of component parts, the left side of the electric junction box in FIG. 1 is referred to as an upper surface, the right side as a lower surface, the lower right side as a front side, and the upper left side as a rear side.

As shown in FIGS. 1 to 3, electric junction box 1 according to the first embodiment houses circuit 20 and heat sink 30 including a planar member, which is designed to dissipate the heat generated from circuit 20, in case 10. Circuit 20 is further mounted with PCB connector 40 and fuse box 50, to which junction connector 60 is attached. Case 10 includes frame 70, made of insulating material such as plastic, and plastic cover 80 attached to close an opening on an upper side of frame 70.

Circuit 20 housed in electric junction box 1 has control circuit board 21 and bus bar 22 adhered to control circuit board 21 as shown in FIG. 2. On one of the front and back surfaces of control circuit board 21 (the upper surface as shown in FIG. 2), a conducting channel (not shown in the figure) is formed in a predetermined pattern and electronic components 23, including a relay, are mounted. On the other surface of the front and back surfaces of control circuit board 21 (the lower surface opposite to the upper surface on which electronic components 23 are mounted as shown in FIG. 2), bus bar 22 is adhered using a thin insulating adhesive sheet. Bus bar 22, formed by punching out a highly conductive metal sheet, has a predetermined conducting channel that forms a power circuit. The external shape of bus bar 22 is formed to substantially fit control circuit board 21.

PCB connector 40 mounted on circuit 20 includes plastic housing 41. The plastic housing 41 is long in the lateral direction of the plastic housing 41 and includes an opening in the front. Housing 41 has L-shaped male terminals 42. Male terminals 42 are inserted from the upper side of control circuit board 21 and then soldered and connected to the lower side. On the lower surface of PCB connector 40, attachment foot 43 is provided and fastened to circuit 20. The attachment foot 43 may be attached to circuit 20 by any suitable fastening device, and in the present embodiment is attached from below using screw 44.

Circuit 20 mounted with PCB connector 40 is installed in the upper side of frame 70 from above, as shown in FIGS. 2 and 3. Also shown in FIGS. 2 and 3, the circuit 20 is then screwed to frame 70 on right and left sides thereof. Frame 70 is formed so that control circuit board 21 and bus bar 22 tightly fit thereinside. Cover 80 is attached to the upper surface of frame 70 and is formed to cover substantially the entire area of the upper surface of control circuit board 21. On a rear side of cover 80, a fitting groove is formed to fit and release a portion of fuse box 50. Cover 80 is attached to frame 70. Cover 80 may be attached to frame 70 by any suitable attachment device, and in the present embodiment, is attached on both right and left ends on the rear side of frame 70.

Fuse box 50 provided on the rear side of cover 80 is formed to have a shape which is long in the lateral direction to cover the rear side of frame 70 for substantially the entire length. Fuse box 50 may be attached to cover 80 by any suitable attachment device. Fuse box 50 may be formed of any suitable material such as, for example, plastic. As shown in FIG. 2, fuse 51 is mounted on fuse box 50 from the rear side. Junction connector 60 attached to fuse box 50 extends laterally to the length direction of fuse box 50.

Figure 4:
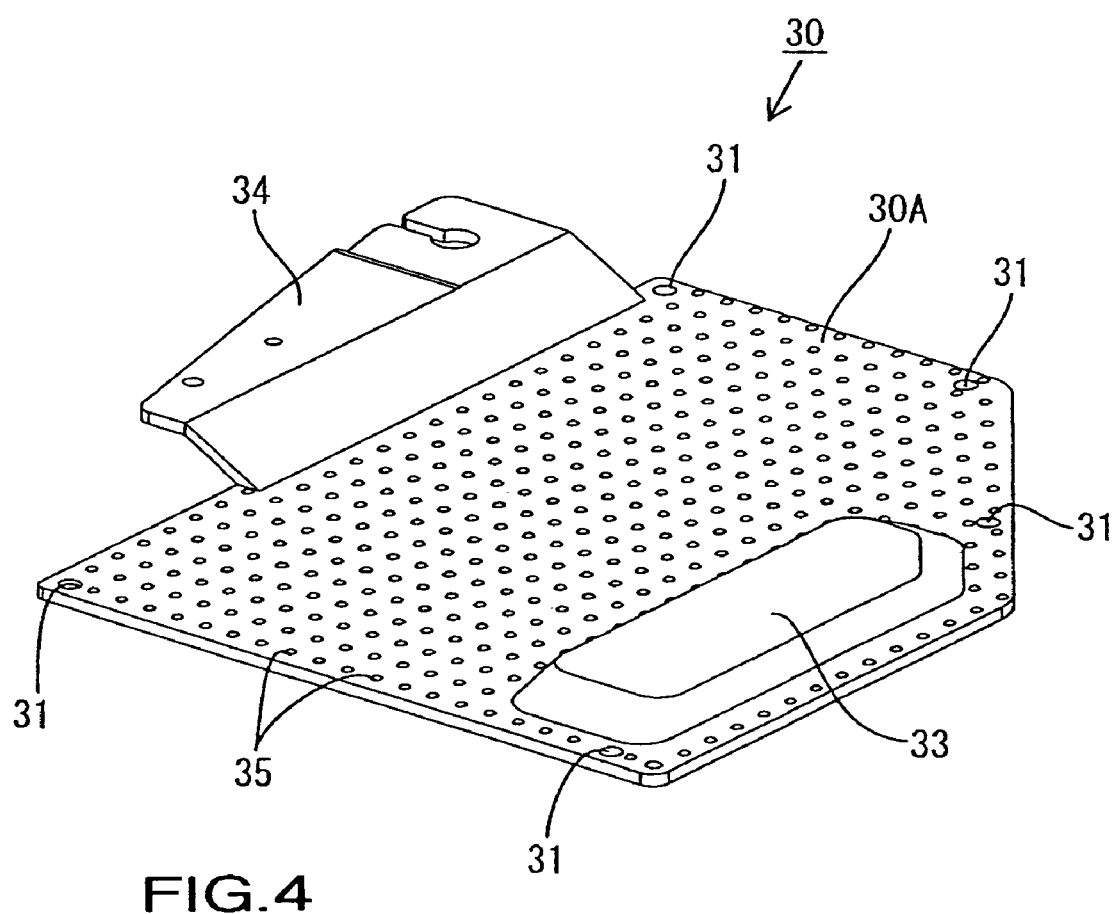
FIG. 4 is a perspective view of the lower side of a heat sink having thermal diffusion portions of the electric junction box of FIG. 1.

FIG. 4 shows the lower side of heat sink 30 having thermal diffusion portions 35. Heat sink 30 mounted on the lower surface of frame 70 is formed in a shape substantially similar to an external shape of frame 70, and is attached to frame 70 so as to cover an opening on the lower side thereof. Further, heat sink 30 is adhered to the lower surface of bus bar 22 using an insulating adhesive. In the present invention, the insulating adhesive corresponds to an insulating layer. In order to dissipate the heat generated from electronic components 23, heat sink 30 is made of a highly conductive material such as, for example, metal sheet, including aluminum.

As shown in FIGS. 3 and 4, through holes 32 are formed at predetermined intervals along a periphery of heat sink 30. The periphery of heat sink 30 is fitted to the lower surface of frame 70. The heat sink 30 may be attached to the frame 70 by any suitable fastening device, and in the present embodiment, heat sink 30 is attached to frame 70 via fastening screws 31 in through holes 32 from the lower side of frame 70.

On the upper side of heat sink 30, escape recess 33 is formed bulging or projecting downward to prevent interference between heat sink 30 and ends of male terminals 42, which are attached to PCB connector 40 and project through the lower side of control circuit board 21. Extending from a rear margin or edge of heat sink 30, attachment piece 34 is provided slanting downwardly. Attachment piece 34 is used to attach electric junction box 1 to a fender side vehicle panel of an engine compartment. Attachment piece 24 may be provided to the heat sink 30 in any suitable manner such as, for example, by being attached thereto or by formed integrally and in one piece therewith.

An area of the heat sink 30 that excludes escape recess 33 and attachment piece 34 includes fitted area 30A that fits onto bus bar 22. On the fitted area 30A of heat sink 30 are provided a plurality of thermal diffusion portions 35. Each of thermal diffusion portions 35 is formed, as shown in FIGS. 2 and 3, having a slightly convex shape, bulging or projecting toward a side of the heat sink exposed to the exterior of the electric junction box 1 and outside air. That is, the thermal diffusion portions 35 extend from the lower surface of the heat sink, which is the side opposite to the surface that contacts bus bar 22 on heat sink 30. At a crest of the convex shape, notch 36 is provided. The notch 36 may be formed when a jig is inserted therein. As shown in FIG. 4, the plurality of thermal diffusion portions 35 are laid out at equal intervals through the length and width of substantially the entire surface of fitted area 30A. The upper surface of the fitted area 30A, that is, the surface that contacts bus bar 22, is a flat surface having no concavity and no convexity.

The function and effectiveness of the first embodiment are described below. While power is supplied, heat generated in electronic components 23, including a relay, travels through bus bar 22 adhered to control circuit board 21, reaches heat sink 30 adhered to the lower surface of bus bar 22, then dissipates into the air through the surface of heat sink 30 exposed to the outside air. Provided with thermal diffusion portions 35 having one of convex and concave shapes on the surface, heat sink 30 has a larger surface area than a surface having no concavity and convexity. Therefore, heat sink 30 allows fast heat dissipation from the surface to the exterior. Heat sink 30 thus provides sufficient heat dissipation while having a planar shape and having no fins, thereby enhancing space efficiency and ensuring heat dissipation simultaneously.

Further, heat sink 30 has thermal diffusion portions 35 on substantially the entire planar surface. Compared to a configuration in which thermal diffusion portions 35 are provided on only a portion of the surface, heat sink 30 has a large surface area, thus accelerating heat diffusion. No variation in the heat diffusion also prevents local heat buildup in circuit 20.

According to the embodiment as described above, providing thermal diffusion portions 35 to heat sink 30 increases the area of heat sink 30 exposed to the outside air. Therefore, the structure of heat sink 30, having no fins or the like, offers sufficient heat dissipation, thus achieving both improved space efficiency and ensured heat dissipation.

Further, providing thermal diffusion portions 35 on substantially the entire planar surface of heat sink 30 enlarges the surface area of heat sink 30, compared to a configuration in which thermal diffusion portions 35 are provided to only a portion of the surface, thereby enhancing the heat dissipation. In addition, the heat dissipation increases throughout the planar surface of heat sink 30, thus preventing local heat buildup in circuit 20. According to the first embodiment, the concavity and convexity of thermal diffusion portions 35 formed on the surface of heat sink 30 gives a quality grip to a tool or fingertips and allows easy holding of heat sink 30 alone or electric junction box 1 to which heat sink 30 is attached, thereby improving the installation operation. In particular, notch 36 at the crest of thermal diffusion portion 35 according to the first embodiment has an opening having a sheer edge, providing a superior grip.

The present invention is not limited to the embodiment explained above with reference to the drawings. Embodiments described below, for example, are also within the technical scope of the present invention. Further to the embodiments below, modified embodiments without departing from the essence of the present invention are possible.

Modifications of the first embodiment of the present invention are described below. In this regard, in the first embodiment, the thermal diffusion portions 35 are provided having a convex, and bulging or projecting, shape. However, in a modification of the first embodiment of the present invention, the thermal diffusion portions 35 are formed having a planar, and bulging or projecting shape.

Further, in the first embodiment, the thermal diffusion portions 35 are formed having the same size and shape. However, in a further modification of the first embodiment, the thermal diffusion portions 35 are provided having different sizes and shapes. Also in the first embodiment, the embodiment, the thermal diffusion portions 35 are positioned at equal intervals. However, a further modification of the first embodiment, the thermal diffusion portions 35 may be positioned at irregular intervals.

Further, in the first embodiment, the thermal diffusion portions 35 are provide on substantially the entire surface of the fitted area of heat sink 30. However, in a modification of the first embodiment, the thermal diffusion portions 35 are positioned on only a portion of the surface.

Figure 5A:
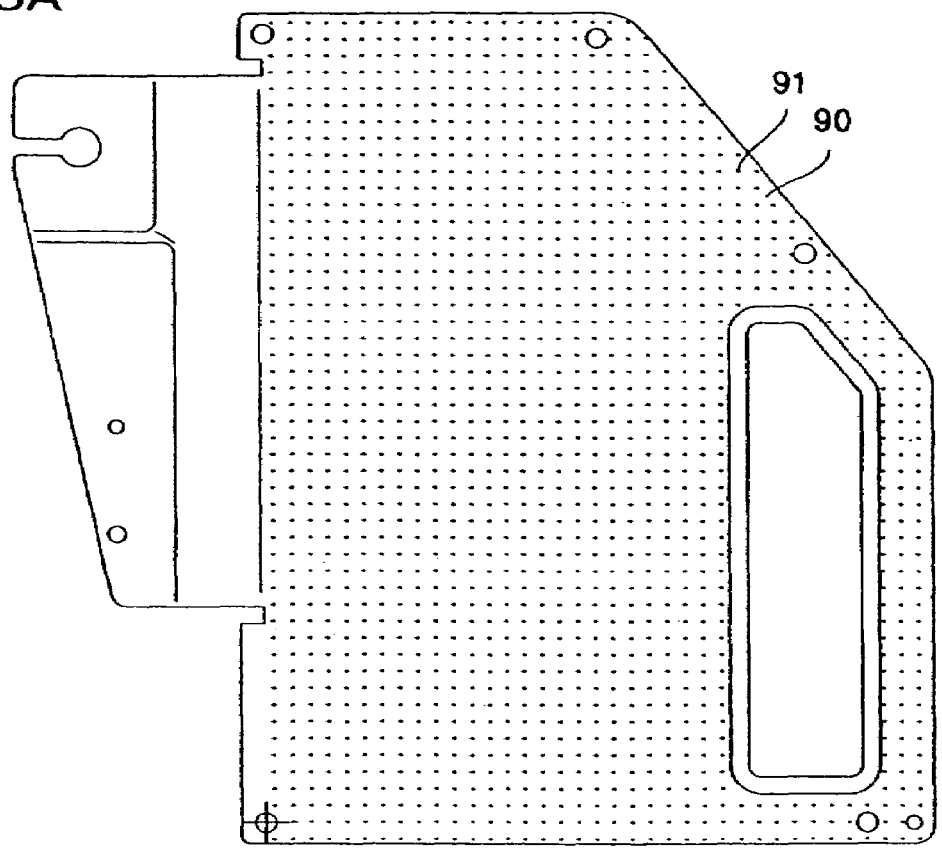
FIG. 5A is a view of a lower side of a heat sink having thermal diffusion portions in an electric junction box according to a second embodiment of the present invention.
Figure 5B:
FIG. 5B is a cross-sectional side view of the heat sink having thermal diffusion portions of FIG. 5A.
Figure 5C:
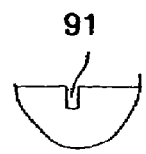
FIG. 5C is an enlarged view of circle R of FIG. 5B.

Additionally, in the first embodiment, the thermal diffusion portions 35 are formed having a convex shape, projecting from the lower side of heat sink 30. The following describes a second embodiment of the present invention with reference to FIGS. 5A-5C. According to the second embodiment, the heat sink 90 includes thermal diffusion portions 91. The thermal diffusion portions 91 of the second embodiment include a concave shape, as shown in FIGS. 5B and 5C. The concave shaped thermal diffusion portions may be formed in any suitable manner such as, for example, by molding with the heat sink 90 or by cutting into the heat sink 90.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

What is claimed is:

1. An electric junction box comprising:

a circuit including a control circuit board and a bus bar, said control circuit board having conductive circuits formed in and electronic components mounted on a first one of front and rear surfaces thereof and said bus bar provided on a second one of the front and rear surfaces of said control circuit board;

a heat sink provided on said bus bar on a surface opposite to the surface facing said control circuit board through an insulating layer, said heat sink including a planar member including thermal diffusion portions having one of substantially hemispherical convex and substantially hemispherical concave shapes on a surface opposite to the surface contacting said bus bar; and a case containing said circuit and said heat sink;

wherein said heat sink includes convex shaped thermal diffusion portions projecting from said surface opposite to the surface contacting said bus bar; and further comprising a notch provided at a crest of each of said convex shaped thermal diffusion portions.

2. The electric junction box according to claim 1, wherein said thermal diffusion portions are provided on substantially the entire planar surface of said planar member of said heat sink.

3. The electric junction box according to claim 1, wherein said thermal diffusion portions are positioned at substantially equal intervals along the length and width of said planar member of said heat sink.

4. The electric junction box according to claim 1, wherein said thermal diffusion portions are formed having substantially uniform size and shape.

5. The electric junction box according to claim 1, wherein said thermal diffusion portions are provided on less than the entire planar surface of said planar member of said heat sink.

6. The electric junction box according to claim 1, wherein said heat sink comprises a metal sheet.

7. A heat sink for a circuit including a control circuit board having conductive circuits formed in and electronic components mounted on a first one of front and rear surfaces thereof and a bus bar provided on a second one of the front and rear surfaces of said control circuit board, said heat sink provided on the bus bar on a surface opposite to the surface facing the control circuit board through an insulating layer, said heat sink comprising:

a planar member including thermal diffusion portions having one of substantially hemispherical convex and substantially hemispherical concave shapes on a surface opposite to the surface contacting the bus bar;

wherein said heat sink includes convex shaped thermal diffusion portions projecting from said surface opposite to the surface contacting the bus bar; and further comprising a notch provided at a crest of each of said convex shaped thermal diffusion portions.

8. The heat sink according to claim 7, wherein said thermal diffusion portions are provided on substantially the entire planar surface of said planar member of said heat sink.

9. The heat sink according to claim 7, wherein said thermal diffusion portions are positioned at substantially equal intervals along the length and width of said planar member of said heat sink.

10. The heat sink according to claim 7, wherein said thermal diffusion portions are formed having substantially uniform size and shape.

11. The heat sink according to claim 7, wherein said thermal diffusion portions are provided on less than the entire planar surface of said planar member of said heat sink.

* * * * *